United States Patent
Barringer et al.

(10) Patent No.: US 8,123,186 B2
(45) Date of Patent: Feb. 28, 2012

(54) RUGGEDIZED MOUNTING ASSEMBLY AND METHOD FOR STABILIZING ONE OR MORE COMPUTER RACKS

(75) Inventors: Dennis R. Barringer, Wallkill, NY (US); Steven C. McIntosh, Kingston, NY (US); Robert W. Nicolaisen, LaGrangeville, NY (US); Budy D. Notohardjono, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 764 days.

(21) Appl. No.: 11/837,206

(22) Filed: Aug. 10, 2007

(65) Prior Publication Data
US 2009/0040692 A1    Feb. 12, 2009

(51) Int. Cl.
*A47H 1/10*    (2006.01)

(52) U.S. Cl. ....................... 248/300; 312/198

(58) Field of Classification Search ............... 312/198, 312/199, 201, 200; 248/300
See application file for complete search history.

(56) References Cited

U.S. PATENT DOCUMENTS

| | | | | |
|---|---|---|---|---|
| 3,403,641 | A * | 10/1968 | Baker | 108/152 |
| 4,104,843 | A * | 8/1978 | Gilb | 52/693 |
| 4,433,881 | A * | 2/1984 | Witten et al. | 312/107.5 |
| 4,449,762 | A * | 5/1984 | Turner | 312/223.3 |
| 4,591,289 | A * | 5/1986 | Vickers et al. | 403/322.4 |
| 5,373,416 | A * | 12/1994 | Tran | 361/674 |
| 5,947,569 | A * | 9/1999 | Rheault et al. | 312/194 |
| 2005/0224683 | A1 * | 10/2005 | Hirayu | 248/500 |

* cited by examiner

Primary Examiner — Amy J Sterling
(74) Attorney, Agent, or Firm — Dennis Jung

(57) ABSTRACT

A ruggedized mounting assembly or bracket and incorporated method and is provided to enhance structural rigidity of a computer environment and provide stability to it during sudden shifts and vibrations. The assembly comprises two intersecting planes. One plane will be disposed on the computer rack at an upper surface while the other plane is to be secured to a surrounding surface such as a ceiling.

7 Claims, 3 Drawing Sheets

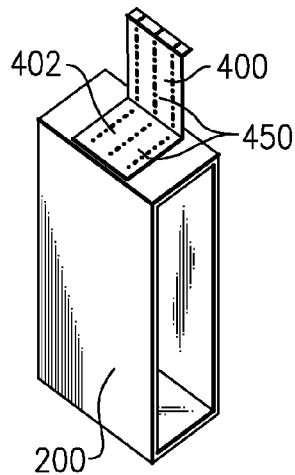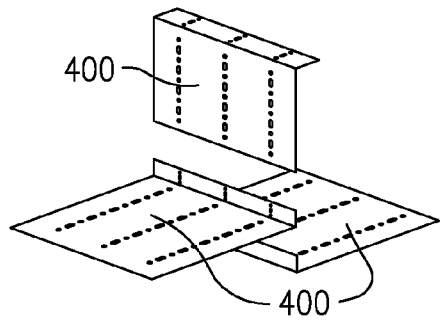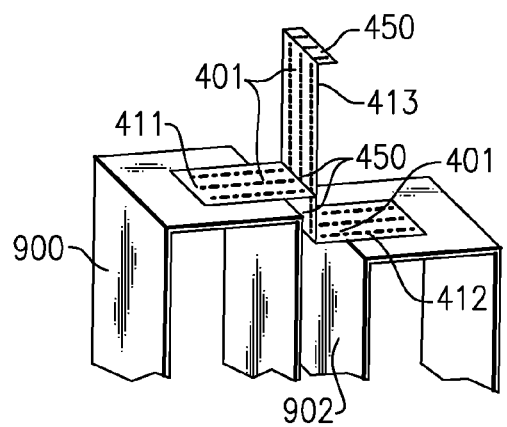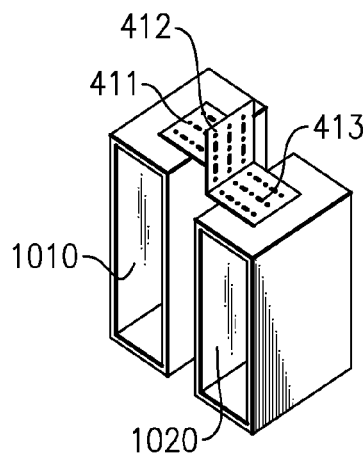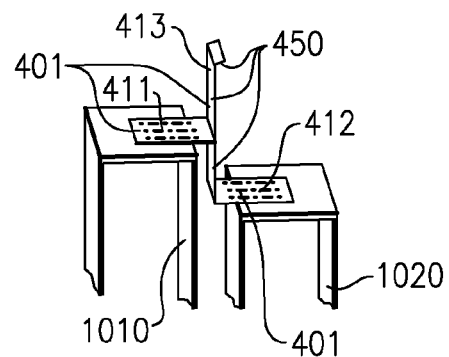

RUGGEDIZED MOUNTING ASSEMBLY AND METHOD FOR STABILIZING ONE OR MORE COMPUTER RACKS

BACKGROUND OF THE INVENTION

1. Field of the Invention

This invention relates to the packaging of computing systems and more particularly to a method and assembly for improving structural integrity of large computing system environments.

2. Description of Background

There is a growing industry trend to provide computers with improved structural integrity. This trend stems from the fact that many businesses today rely heavily on computer integrity for continued services. In recent years, both environmental catastrophic events and man-made conditions have proved that in times of emergency, there is even more reliance on large computing systems to help save lives and restoring infrastructures. This need has placed a greater demand on the designers of computer system to provide ruggedized environments that are structurally enhanced and are able to better withstand sudden abnormal shock or persistent vibrations for long periods of time. Such factors as heat dissipation, electrical connections and others have to be considered carefully in the "ruggedization" of such environments. An environment's inability to withstand such extreme conditions may cause data loss and system collapse at a critical time.

The prior art has tried to resolve the problems that arise from poorly ruggedized environment in a number of ways, but most of these solutions are inadequate or are meant to only provide a temporary relief. For example, in areas that are routinely exposed to earthquakes or vibrations, the rack is bolted to the floor structure in an attempt to stabilize the computing environment during such vibrations. This solution may work if the vibration is not too great or if the total rack content does not exceed 2000 lbs. Unfortunately, this solution does not work for systems that are more complex and often weigh in the range of 3600 lbs or more as simply bolting the rack down will not be enough to ruggedize the system environment in a manner that makes it immune to such vibrations.

In another attempt to provide such solutions, prior art has introduced integrated flexible frame tie down retention systems (used both in raised and non-raised floor environments) and computer equipments having some earthquake damage protection mechanisms. Unfortunately, these solutions are either ineffective in events that cause large vibrations or are alternatively, cost prohibitive and/or too impractical to implement.

Another problem with the solutions provided by the prior art is that the flexible frame tie or the bolting of the rack does not take into consideration the problems with center of gravity. During prolonged vibrations or as a result of sudden movement, unbalanced computer racks can topple and/or shift so that electrical shorts and disconnects ensue.

Consequently, it is desirable to introduce a solution that can provide improved ruggedized structures that can provide protection against abnormal shocks and vibrations with solutions that are permanent and effective. It is particularly desirable to stabilize the upper portions of computer racks.

SUMMARY OF THE INVENTION

The shortcomings of the prior art are overcome and additional advantages are provided through the provision of a ruggedized mounting assembly or bracket and incorporated method. The assembly/bracket and the method are provided to enhance structural rigidity of a computer environment and provide stability to it during sudden shifts and vibrations. The assembly comprises two intersecting planes. One plane will be disposed on the computer rack at an upper surface while the other plane is to be secured to a surrounding surface such as a ceiling. The planes can be different in size and in one embodiment comprise a plurality of holes for securing them to the rack and other surfaces.

In alternate embodiments a plurality of brackets/assemblies are used in conjunction with a single or multiple rack, to enhance rigidity of a single rack or to connect two racks to one another and to the surrounding surfaces securely. The racks and the multiple brackets/assemblies may be identical or be of different heights and sizes to satisfy particular needs.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 7 is an illustration of an alternate embodiment of the present invention utilizing a plurality mounting assemblies/brackets can be used in conjunction with a single rack to enhance ruggedization;

FIG. 8 illustrate a multi-assembly/bracket environment;

FIG. 9, is and illustration of the use of multi brackets of FIG. 8 as applied to a two racks environment where the racks are placed adjacent to one another; and FIGS. 10 and 11 are different views of an alternate embodiment of the present invention having two racks of different heights disposed adjacent to one another but at distance from one another.

DESCRIPTION OF THE INVENTION

Figure 1:
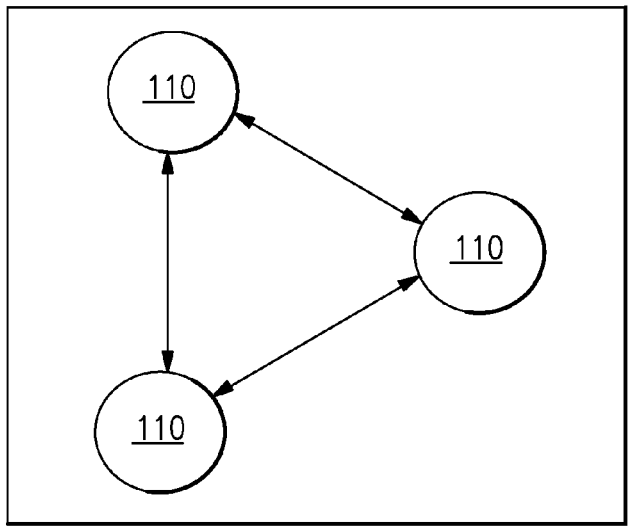
FIG. 1 is an illustration of a computing environment having a plurality of nodes.

FIG. 1 is an illustration of a computer environment having one or more nodes 110 in processing communication with one another. Each node 110 can comprise a single computer or a network of computers. A variety of electronic components are used for each node that can be housed in one or more racks or frames as will be illustrated in other figures below. The term rack or frame is used to simply imply housing or an assembly that stores such components. In times, a single rack can be associated with a single node but that is not always the case as appreciated by those skilled in the art. It should also be noted that a single rack can comprise several nodes, while several racks can also constitute a single node.

Figure 2:
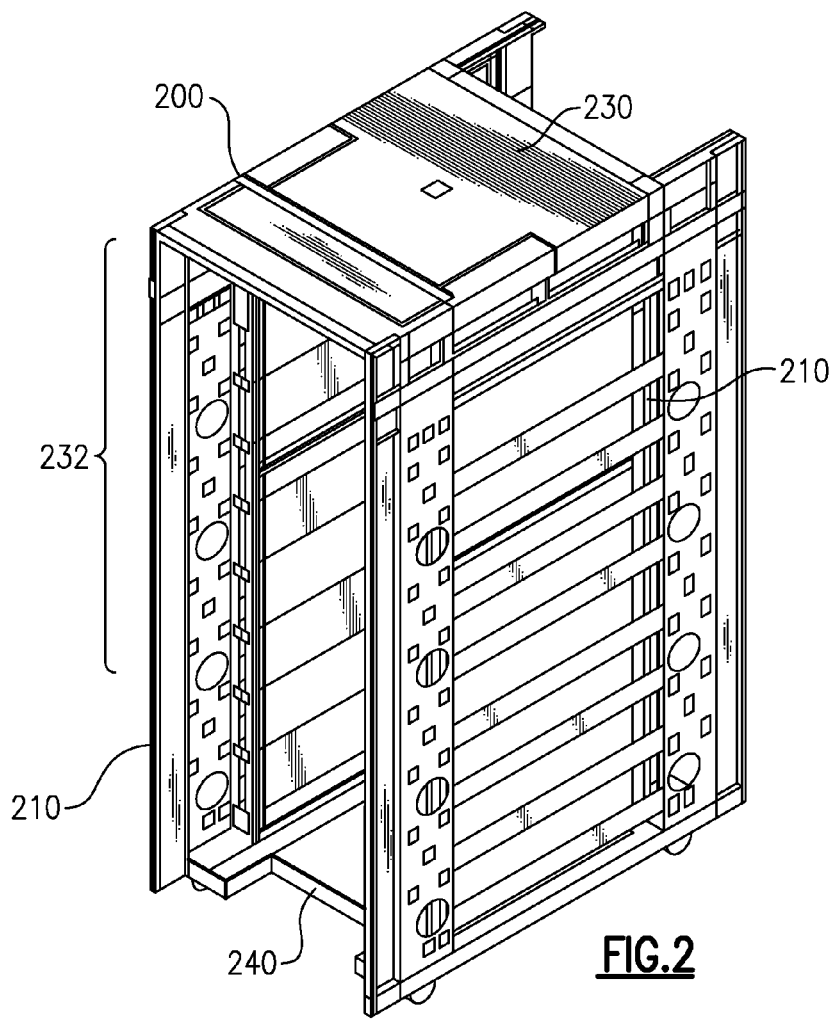
FIG. 2 is an illustration of a rack or frame housing electronic components that make up one of more nodes of the environment illustrated in FIG. 1.

FIG. 2 provides such a rack, referenced as 200, used for housing electronic components such as CECs and other such units. In this particular embodiment, the rack 200 is shown having a plurality of surfaces, namely sides 210, a top 230 and a bottom 240. The electronic components can be housed inside the rack 200 such as by placing them on boards or in other arrangements as known to those skilled in the art. The shape of the rack as provided in the figure is to reflect an exemplary design, but the workings of the present invention can be altered easily to accommodate any other designs.

As discussed earlier, one problem with conventional racks used in the prior art is that their inability to withstand sudden shocks of great magnitudes or even exposure to long term and continuous vibrations. Bolting the rack to the floor or securing it in one direction is not a plausible solution in all situations. In instances where vibrations are continuous or the force is great and the center of the gravity of the rack is not optimized the components placed in the top portions of the rack, which by way of example are referenced in FIG. 2 as 232, have a potential to fall or shift. Such shift can cause electrical shorts and disconnections which can cause a variety of system integrity problems and even hazardous conditions. Moreover, many of the prior art racks, even those that are designed to be inherently rigid structurally are enhanced in a vertical and/or the in-out direction. Consequently, when these racks are subjected to a side to side vibration or shock of any prolonged duration or great force, they fail to provide the structural rigidity that is desired and required of their frame.

Figure 3:
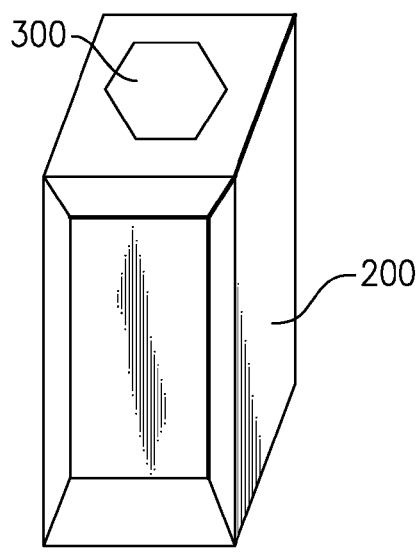
FIG. 3 is an illustration of one embodiment of the present invention having an ruggedized bracket or upper mounting assembly assembly or bracket used for ruggedization of a computing system.

FIG. 3 provides for one embodiment of the present invention where the rack assembly 200 is structurally ruggedized by addition of an ruggedized bracket or upper mounting assembly as referenced in FIG. 3 as 300. As can be understood, the rack referenced as 200 is similar to the one discussed in the embodiment of FIG. 2 but is illustrated in a more simple design, in this figure, for ease of understanding. The upper mount design enables the securing of the rack or frame particularly to an upper surfaces or ceiling as will be discussed in more detail below. This design mitigates side sudden impact as well as other issues previously discussed during sudden shocks such as explosions and earthquakes or other similar catastrophes.

In the embodiment of FIG. 3, the ruggedized bracket or upper mounting assembly 300 is shown as a hexagon to illustrate that a number of designs can be available and such designs can be altered to reflect the design and particular needs of each rack. This is an important issue because computing environments can be provided not just in raised floors of office buildings and other conventional environments but increasingly they are being incorporated and employed in other compact locations such as on board ships, space shuttles and other spaces with compact or limited footprints. In this way, the ruggedized bracket or upper mounting assembly 300 can be secured to a number of surfaces and can be designed to satisfy a variety of designs.

Currently there is no versatile mounting present in the prior art designs that can provide an ruggedized bracket or upper mounting assembly to a different surface, such as an upper mounting, that can be conducted with versatility and is easily incorporated into alternate design features of such compact footprints.

Figure 4:
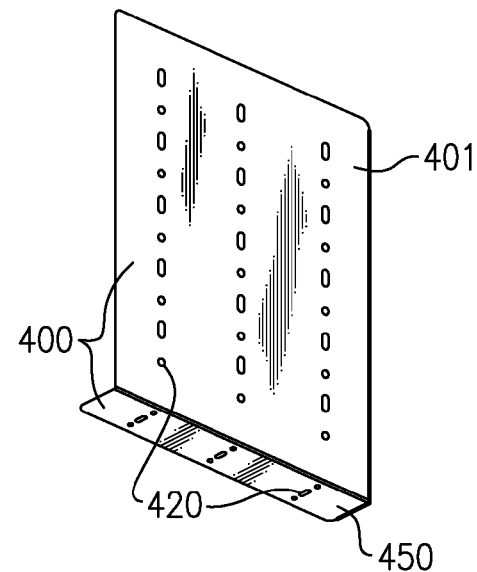
FIG. 4 is an illustration of a preferred embodiment for the ruggedized bracket or upper mounting assembly assembly of FIG. 3.

FIG. 4, is an illustration of a preferred design for an ruggedized bracket or upper mounting assembly, herein referenced separately as 400, that is specifically designed for the rack design discussed in conjunction with the embodiment of FIG. 2. Since the rack 200 of FIG. 2 is a rectangular cube, the design of the ruggedized bracket or upper mounting assembly illustrated in FIG. 4 is also designed to reflect this particular arrangement with the understanding that other designs are achievable. Subsequently, the ruggedized bracket/assembly of FIG. 3 is now referenced as 400 to reflect the distinction.

In the embodiment of FIG. 4, the ruggedized bracket/assembly 400 comprises of two intersecting planes 401 and 450. These planes preferably intersect one another at a right angle, and the planed terminate at the point of intersection such that an L shaped design is created. The two planes are of different sizes, such that in a preferred embodiment the first plane 401 has a larger area than that of the second plane 450. In this embodiment, the planes are also rectangular in size, with one plane 450 having much shorter legs than that of second plane 401 as illustrated. The bracket/assembly is preferably fabricated of a rugged material including but not limited to metals and/or metal compounds.

A plurality of holes or openings 420 are also provided for securing the bracket/assembly 400 subsequently to the computer rack(s) and other surrounding area(s). The holes are used in conjunction with fastening means as known to those skilled in the art including but not limited to screws, holes, nails and other such means. The holes/openings can be uniformly similar in size or can come in different sizes. They are preferably disposed on both bracket planes 401 and 450 but their disposition can be of any desired patterns. In the illustration of this figures, the holes 420 are provided on single rows and disposed at regular intervals, but this is only an example of many achievable designs possible.

The bracket/assembly can be used alone or as a plurality in conjunction with one or more racks and surfaces. FIGS. 5 through 11, are introduced to provide some examples of many different embodiments. These examples, however, are not intended to cover the exhaustive list of all possible embodiments and are only to ease understanding. Multiple brackets can be utilized to enhance ruggedization of a single rack, or to connect two or racks, sometimes of different heights that are disposed in a variety of distances from one another. Similarly, a single bracket/assembly can be used to connect two or more racks to one another. The brackets/assemblies used for each instance, can be identical or vary from one another and their plane sizes can vary according to their intended use. For example, one plane can be designed to be as long as the width or length of the top of a rack, while another may be designed to be shorter or alternatively longer.

Figure 5:
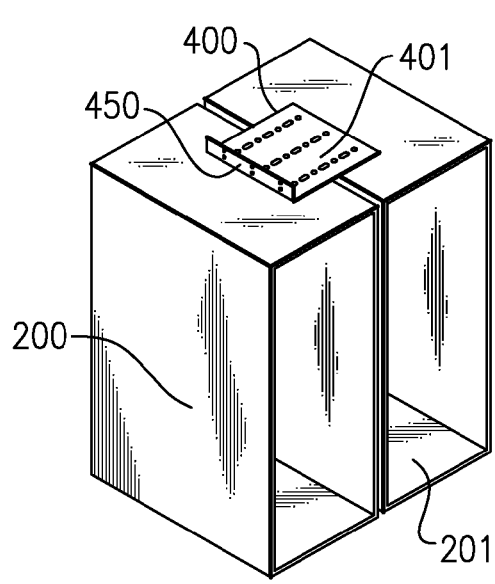
FIGS. 5 and 6 illustrate the use of the ruggedized bracket or upper mounting assembly assembly of FIG. 4 with two racks that are disposed adjacent to one another with or without a distance in between them.

In the illustration of FIG. 5, two racks referenced as 200 and 201 are shown. The two racks 200 and 201 can be identical to one another and the rack as discussed in the embodiment of FIG. 2. In other embodiments, however, it is possible to have two racks that are different in a variety of different ways.

In the embodiment of FIG. 5, a single ruggedized bracket or upper mounting assembly 400 is provided. In this embodiment, the ruggedized bracket or upper mounting assembly 400 is similar to the one discussed in conjunction with the embodiment of FIG. 4. As illustrated in the figure, the two racks 200 and 201 are placed adjacent to one another without any substantial distance between them. It should be noted that the position of the racks is not important. In fact a similar embodiment can be achieved if the racks were placed in a mirror image position, but still with one side touching similar to the illustrated arrangement. Alternatively, the racks can be rotated in a variety of ways to provide a similar arrangement.

The ruggedized bracket or upper mounting assembly 400 is then secured to the top of both racks. In this embodiment the larger rectangular area 401 of the ruggedized bracket or upper mounting assembly 400 is secured to at least one portion of the top of each of the top two racks such that once the portion 401 is secured to both racks, the racks 200 and 201 are secured to one another.

In addition, as illustrated in the figure, the smaller rectangular area or plane 450 of the ruggedized bracket or upper mounting assembly 400 is not directly secured to either rack but is sticking in an upwards position, ready to be secured to an outside surface such as the ceiling to provide additional support for the racks 200 and 201.

Figure 6:
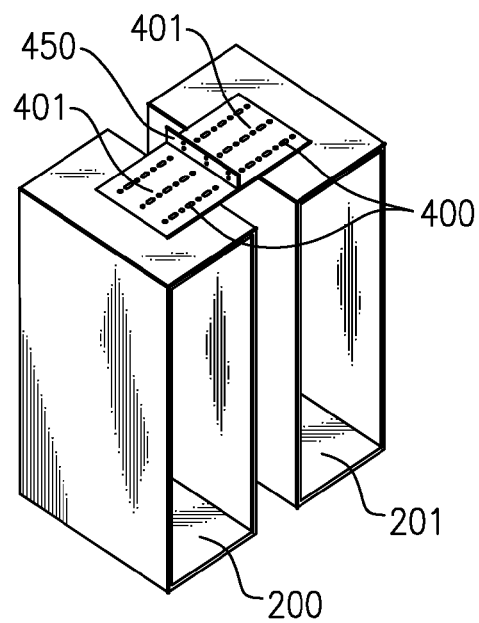

FIG. 6 provides an alternate embodiment of the present invention. In the embodiment of FIG. 6, again two adjacent racks 200 and 201 are shown. As before, the racks can be identical or different from to one another. As before, the two racks can be rotated in a variety of ways and be placed alternatively in different positions to provide a similar arrangement to the one currently being discussed.

In this embodiment, there are two ruggedized brackets/assemblies that are each referenced as 400 but additional brackets/assemblies can also be used. The illustrated figure provides for identical ruggedized brackets/assemblies for ease of understanding, but it is possible when desired to use ruggedized brackets/assemblies that are dissimilar in size and/or designs.

The two ruggedized bracket or upper mounting assembly s of FIG. 6, are placed such that they secure the two racks 200 and 201 to one another despite the distance that separates them. As shown the two ruggedized bracket or upper mounting assembly s are placed such that the two larger rectangular areas 401 of the ruggedized bracket or upper mounting assembly s 400 are secured each to the top portion of alternate racks such that the two smaller rectangular areas 450 of each rack can touch and be secured to one another.

In FIG. 5, where the frames or racks are close together, one ruggedized bracket or upper mounting assembly 400 can be used (and is only needed) to secure the frames to one another and to other surfaces. The holes of the one side—i.e. the long side—of the ruggedized bracket or upper mounting assembly is used to mount the bracket/mounting to the top of the first frame and the other side of the long bracket/mounting will be mounted to the second rack. It should be pointed out, however, that in FIG. 6, where the two frames/racks are not close to one another, two or more brackets/mountings may be used and are needed. In this case, the short leg of the brackets/mountings will be bolted to the second bracket/mounting. The long leg of the first bracket/mounting will be mounted to the first rack and the long leg of the second bracket/mounting will be bolted to the top of the second rack.

In FIG. 7 an alternate embodiment is provided illustrating the ue of multiple brackets/assemblies 400 in conjunction with a single frame/rack 200 to enhance ruggedization. As before the brackets/mountings 400 can be similar or dissimilar and for ease of understanding are both referenced as 400 in this figure. In this embodiment, one of the brackets/assemblies 400 is secured to the rack such one of its planes is secured to the top of the rack 200. The other plane is placed upwards and will be secured to another plane of the second another rack. The remaining plane of the second rack is then free for mounting to an outside surface such as a ceiling.

FIGS. 8 and 9, provide illustrations of use of multiple brackets in conjunction with racks of different heights. Three identical brackets are illustrated in FIG. 8, but these brackets may be of different sizes and shapes in other embodiments. In FIG. 9 the brackets illustrated in the embodiment of FIG. 8 are used to compensate for the height difference between the racks.

As illustrated in FIG. 9 two racks of different heights referenced as 900 and 902 are provided. The placement of the two racks are adjacent to one another without much distance between them. As before, the racks may be oriented in a variety of positions, such as rotated to face each other.

For ease of reference, the brackets formerly referenced as 400 have been allocated their own numerical identification. The first bracket/assembly is referenced as 411, with the second and third bracket/assembly being referenced respectively as 412 and 413. Brackets 411 and 412 are each secured to an upper surface, herein the top, of the racks 900 and 902. In this particular arrangement, the plane (401) of each bracket/assembly 411 and 412 are secured to the respective rack surfaces, leaving the smaller plane or rectangular area 450 free to be subsequently secured to a third bracket/assembly (or other surfaces if desired). In this arrangement, the smaller plane/rectangular area 450 of both bracket/assemblies 411 and 412 are disposed such as to face each other. In this way, then a third bracket/assembly 413 can be then disposed between the two bracket/assemblies 411 and 412 and secured to their respective smaller area planes 450. It should be noted that in this arrangement, due to the height difference between the racks 900 and 902, the point of attachment of bracket/assembly 413 is lower for securing it to bracket/assembly 412 than it is in case of the bracket/assembly 411. The holes and fastening means as was discussed earlier will be used for ensuring proper attachments. Since multiple bracket/assemblies are used here, in each case the particular embodiment has to provide for hole design and pattern that are compatible with one another, such that they can be properly aligned for optimum results.

Furthermore, in the arrangement of FIG. 9, the larger plane 401 of the bracket/assembly 413 is secured to the bracket/assemblies 411 and 412. This leaves the smaller plane or rectangular area 450 of the bracket/assembly 413 free so that it can be secured to surrounding surfaces, such as a ceiling or upper wall area.

FIGS. 10 and 11 provide an different views of an alternate embodiment of the present invention. The arrangement of FIGS. 10 and 11 is somewhat similar to that of FIGS. 8 and 9 in that two racks of different heights, referenced as 1010 and 1020 respectively are provided. The racks can also be easily of different sizes or different geometries. The racks are still placed adjacent but at a distance from one another, so that as illustrated there is a visible gap between them. As was the case previously, a plurality of brackets/mountings are used to secure the two racks to one another and to other surrounding surfaces. For consistency and ease of understanding, once again three identical bracket/assemblies similarly referenced as 411, 412 and 413 respectively are illustrated with the understanding that other embodiments utilizing brackets/assemblies of different sizes and configurations can be employed.

As before, in this embodiment, the larger planes or rectangular areas of each bracket/assembly 411 and 412 are disposed on the top surface of the racks 1010 and 1020. Since there is a distance between the two racks 1010 and 1020 in this arrangement, the brackets/assemblies 411 and 412 are designed and placed as to be partially disposed over the rack tops. The other portion of the plane 401 of brackets/assemblies 411 and 412 extends out so as to bridge the gap between the two racks. Since the racks are not of equal height, the planes 401 of bracket/assemblies 411 and 412 do not actually intersect, until third bracket/assembly 413 is disposed in between them. In this embodiment, the larger plane or rectangular area 401 of bracket/assembly 413 is disposed between the two bracket/assemblies 411 and 412. In this embodiment, the area 401 of bracket/assembly 413 will be secured to the smaller plane/rectangular area 450 of respective bracket/assemblies 411 and 412 since they are disposed such that they face another and toward the center of the gap between the two racks. As before holes and fastening means has to be designed and used such that the alignment and securing of the three brackets/assemblies 411, 412 and 413 are easily achievable. The smaller plane/rectangular area of the bracket/assembly 413 is left unhampered so that it can be subsequently secured to a surrounding surface such as the ceiling.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for stabilizing upper portions of a plurality of computer racks housing electronic components, the method comprising:

securing a first bracket to a first computer rack, the first computer rack including a first top surface at a first height, the first bracket including a first proximate end and a first distal end, the first proximate end secured to the first top surface of the first computer rack, the first bracket including at least two intersecting surfaces;

securing a second bracket to a second computer rack, the second computer rack including a second top surface at a second height, the second bracket including a second proximate end secured to the second top surface of the second computer rack, the second bracket including at least two intersecting surfaces; and securing the first distal end of the first bracket to the second distal end of the second bracket.

2. The method of claim 1, further comprising positioning the second computer rack adjacent to the first computer rack.

3. The method of claim 1, wherein the at least two intersecting surfaces of both the first bracket and the second bracket are orthogonal to each other.

4. A system for stabilizing upper portions of computer racks housing electronic components, the system comprising:

a first computer rack having a first top surface at a first height;

a second computer rack having a second top surface at a second height, the second computer rack positioned adjacent to the first computer rack;

a first bracket including a first proximate end and a first distal end, the first proximate end secured to the first top surface of the first computer rack, the first bracket including at least two intersecting surfaces;

a second bracket including a second proximate end and a second distal end, the second proximate end secured to the second top surface of the second computer rack, the second bracket including at least two intersecting surfaces, the second distal end secured to the first distal end.

5. The system of claim 4, further comprising a third bracket including a third proximate end and a third distal end, the third proximate end secured to the first distal end of the first bracket and the second distal end of the second bracket, the third distal end secured to a surrounding surface.

6. The system of claim 4, wherein the at least two intersecting surfaces of both the first bracket and the second bracket are orthogonal to each other.

7. The system of claim 4, wherein the first height is different than the second height.

* * * * *